ized by the US008779866B2

(12) United States Patent
Koyama

(10) Patent No.: US 8,779,866 B2
(45) Date of Patent: Jul. 15, 2014

(54) OSCILLATOR

(75) Inventor: Yasushi Koyama, Kamakura (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/517,361

(22) PCT Filed: Dec. 10, 2010

(86) PCT No.: PCT/JP2010/072729
§ 371 (c)(1),
(2), (4) Date: Jun. 20, 2012

(87) PCT Pub. No.: WO2011/078064
PCT Pub. Date: Jun. 30, 2011

(65) Prior Publication Data
US 2012/0274410 A1    Nov. 1, 2012

(30) Foreign Application Priority Data

Dec. 25, 2009  (JP) ................................ 2009-295443

(51) Int. Cl.
*H03B 5/30*     (2006.01)
(52) U.S. Cl.
USPC .......................................... 331/155; 331/154
(58) Field of Classification Search
USPC ................ 257/506; 343/700 MS; 331/107 T, 331/107 SL, 154, 155
See application file for complete search history.

(56) References Cited

U.S. PATENT DOCUMENTS 3,525,947 A * 8/1970 Winstel et al. .................... 330/4
4,935,935 A * 6/1990 Reed et al. ................. 372/44.01
7,463,104 B2 * 12/2008 Sekiguchi et al. ...... 331/107 SL
7,830,926 B1    11/2010 Kim
2006/0214176 A1 *  9/2006 Ouchi et al. ..................... 257/98
2008/0231384 A1    9/2008 Sekiguchi
2009/0051452 A1 *  2/2009 Asada et al. ............... 331/107 T
2010/0026399 A1 *  2/2010 Frazier ....................... 331/107 T

FOREIGN PATENT DOCUMENTS

CN    101151797 A    3/2008
JP    2007-124250 A    5/2007

OTHER PUBLICATIONS

Jian Wang, et al., "A GaAS Acoustic Sensor Based on Resonant Tunnelling Diodes," IEEE Sensors, Oct. 22-25, 2006, EXCO, Daegu, Korea, pp. 1107-1110.
Irina Jaeger et al., "Millimetre Wave Signal Generation Using Resonant Tunneling Diodes NLTL-resonators," Microwave and Optical Technology Letters, vol. 49, No. 12, Dec. 1, 2007, pp. 2907-2909.
E. R. Brown et al., "A Quasioptical Resonant-Tunneling-Diode Oscillator Operating Above 200 GHZ," IEEE Transactions on Microwave Theory and Techniques, vol. 41, No. 4, Apr. 1, 1993, pp. 720-722.
Kabula Mutamba et al., "A GaAS Pressure Sensor With Frequency Output Based on Resonant Tunneling Diodes," IEEE Transactions on Instrumentation and Measurement, vol. 48, No. 6, Dec. 1999, pp. 1333-1338.

* cited by examiner

*Primary Examiner* — Joseph Chang
*Assistant Examiner* — Jeffrey Shin
(74) *Attorney, Agent, or Firm* — Canon USA, Inc. IP Division

(57)    ABSTRACT

The present invention relates to an oscillator. The oscillator includes a resonator unit configured to resonate terahertz waves generated by an active layer using intersubband transitions of a carrier. The oscillator further includes a strain generating unit configured to generate strain of the active layer. Still furthermore, the oscillator includes a control unit configured to control the strain generating unit in accordance with the oscillation characteristic (the frequency or the output) of the terahertz waves resonated by the resonator unit.

12 Claims, 8 Drawing Sheets

FIG. 2
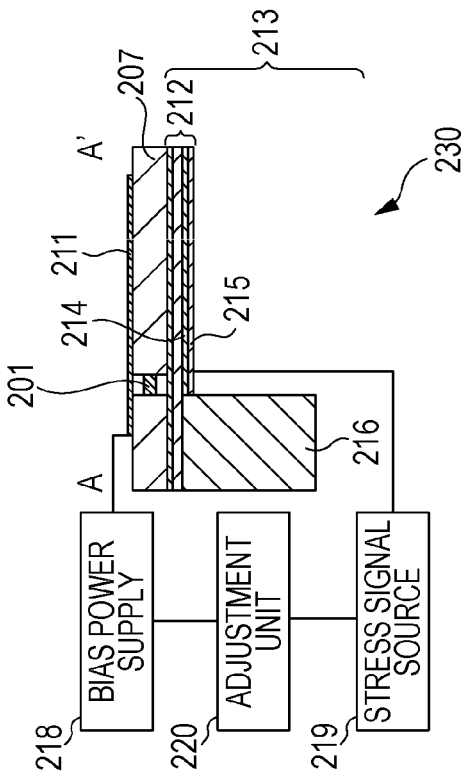
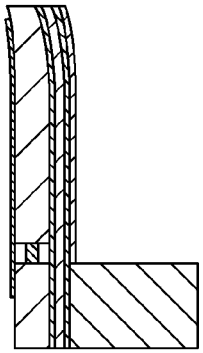
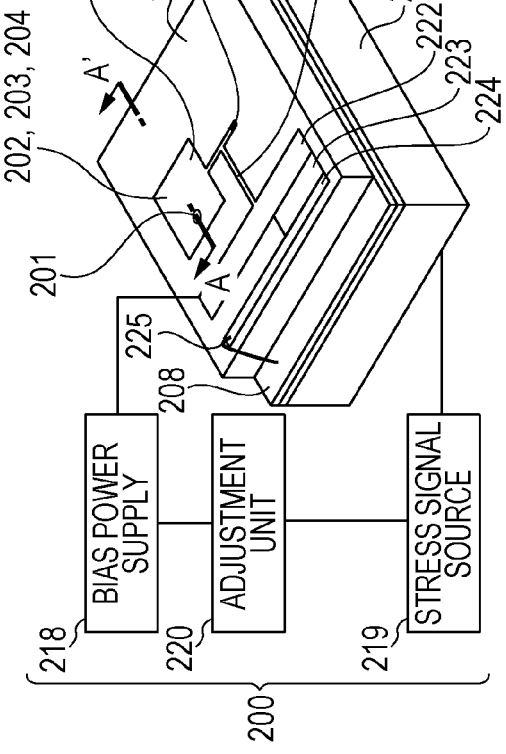
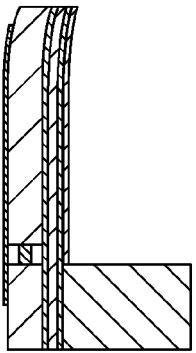

FIG. 4A
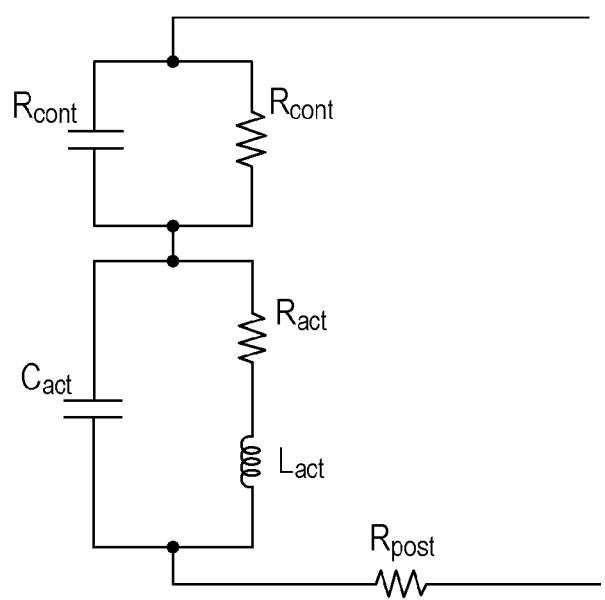
FIG. 4B
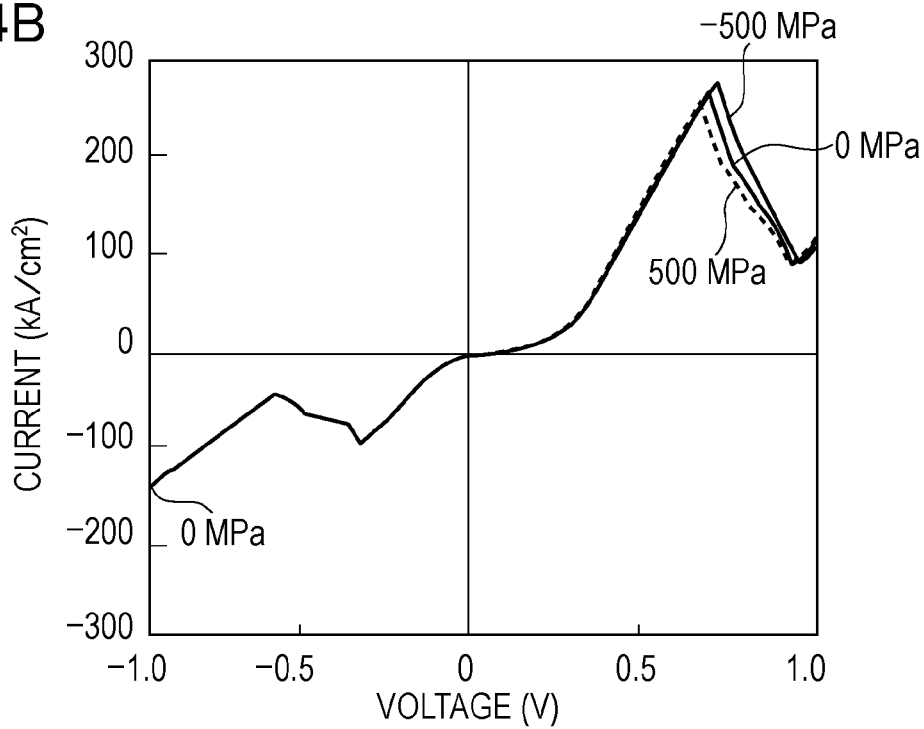
FIG. 4C
| σ (MPa) | LOAD (gf) | RTD φ (um) | NDR (Ω) | FREQUENCY (GHz) |
|---|---|---|---|---|
| −500 | −0.2 | 2 | −12.5 | 425 |
| 0 | 0.0 | 2 | −22.2 | 455 |
| 500 | 0.2 | 2 | −39.6 | 465 |

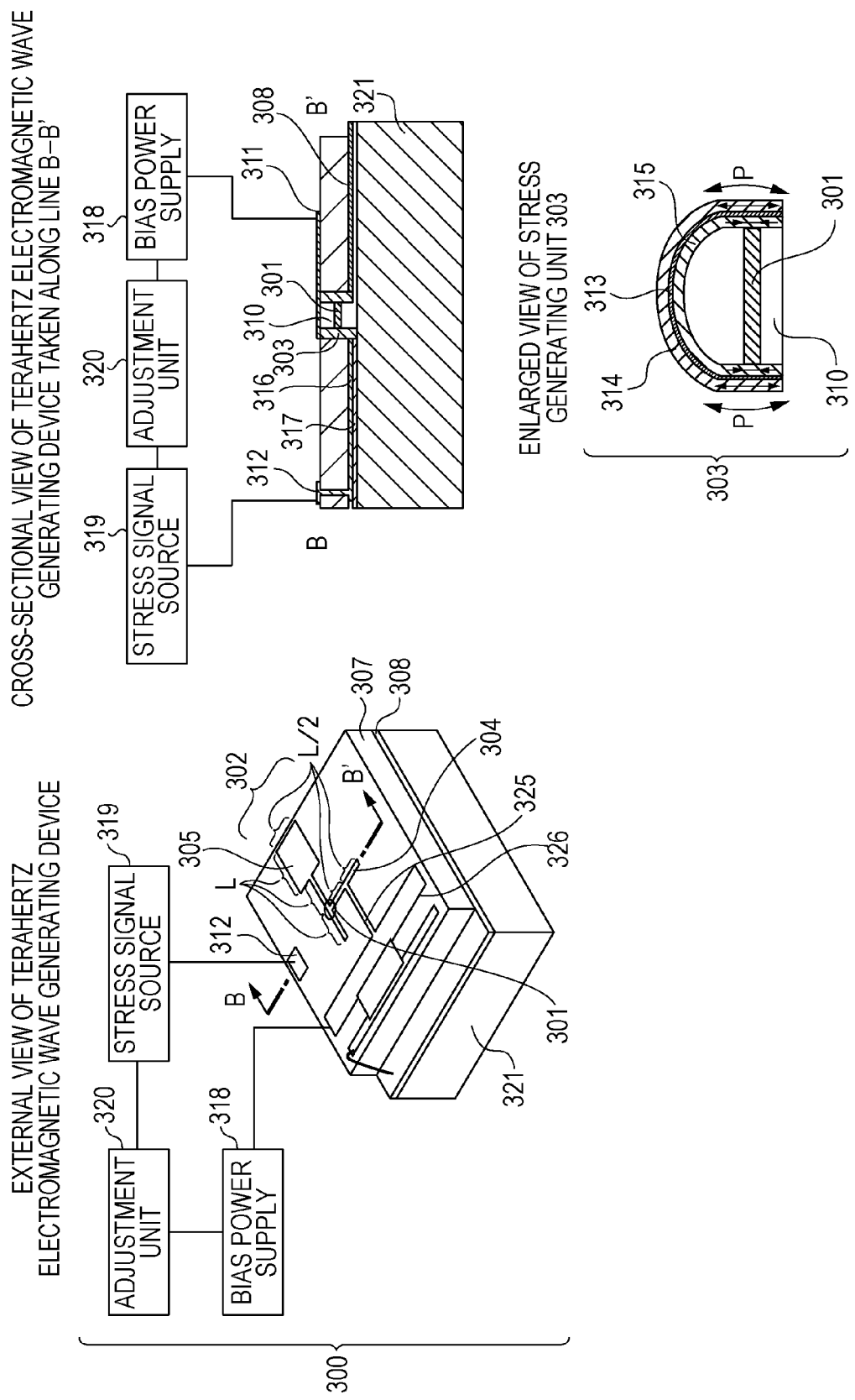

OSCILLATOR

TECHNICAL FIELD

The present invention relates to an oscillator for oscillating terahertz waves.

BACKGROUND ART

In general, a quantum-cascade laser and a resonant tunneling diode (hereinafter referred to as an "RTD") are used as an active layer of a current injection oscillator for generating terahertz waves (having a frequency of 30 GHz or higher and 30 THz or lower in the preset specification). A quantum-cascade laser and an RTD provide electromagnetic wave oscillation on the basis of intersubband transition of an electron in a quantum well structure of a semiconductor.

In particular, PTL 1 describes a device using a double-barrier RTD as an active layer for oscillating terahertz waves in a frequency band near 1 THz at room temperature. The double-barrier RTD includes an InGaAs quantum well layer and an InAlAs tunnel barrier layer, which are epitaxially grown on InP. The RTD generates electromagnetic waves using simulated emission in the range of a negative differential resistance appearing in the current-voltage characteristic. In addition, NPL 1 describes a structure that varies a frequency of a center frequency of 470 GHz and a variable width of 18 GHz by varying the driving voltage within the range in which the negative differential resistance appears.

CITATION LIST

Patent Literature

PTL 1 Japanese Patent Laid-Open No. 2007-124250

Non Patent Literature

NPL 1 IEEE, VOL. 48, No. 6, pp. 1333-1338, 1999

SUMMARY OF INVENTION

Technical Problem

NPL 1 describes a technology based on a constant negative differential resistance. If the driving voltage is changed in order to change the frequency of the oscillating terahertz waves, the output (the power) of the oscillating terahertz waves is also changed, which is problematic.

Solution to Problem

According to the present invention, an oscillator for oscillating terahertz waves includes an active layer configured to generate terahertz waves by transition of a carrier between sub-bands, a resonator unit configured to resonate the terahertz waves generated by the active layer, a strain generating unit configured to generate strain of the active layer, and a control unit configured to control the strain generating unit in accordance with an oscillation characteristic of the terahertz waves resonated by the resonator unit.

Advantageous Effects of Invention

According to the present invention, the oscillator can vary a negative differential resistance appearing in a current-voltage (I-V) characteristic of the oscillator by generating a stress in the active layer that generates terahertz waves. In this way, an oscillator having an excellent controllability of the frequency and the output (the power) of the oscillating terahertz waves can be provided.

BRIEF DESCRIPTION OF DRAWINGS

FIG. 2 is a schematic illustration of the configuration of a terahertz wave generating device according to a first embodiment of the present invention.

FIGS. 4A to 4C are schematic illustrations of the terahertz wave generating device according to the first embodiment.

FIG. 5 is a schematic illustration of the configuration of a terahertz wave generating device according to a second embodiment of the present invention.

DESCRIPTION OF EMBODIMENTS

Figure 1A:
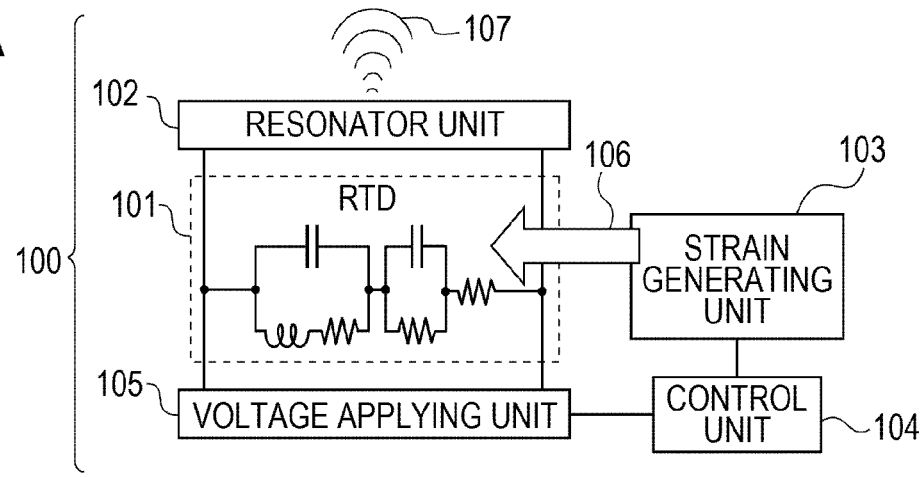
FIGS. 1A to 1C are schematic illustrations of a terahertz wave generating device according to an embodiment of the present invention.
Figure 1B:
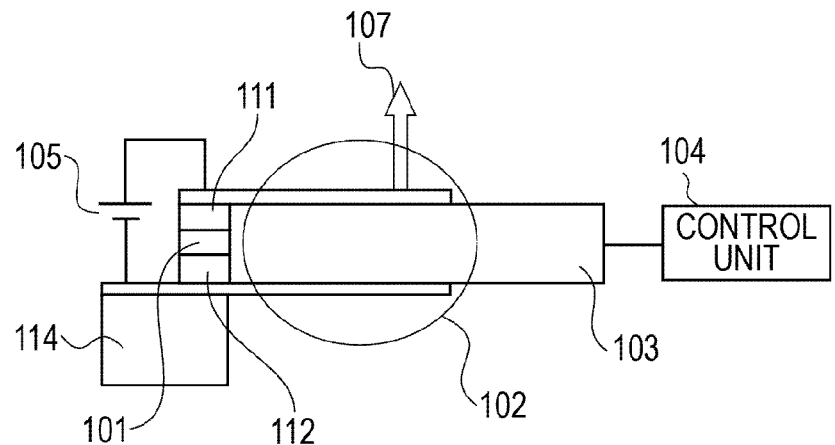
Figure 1C:
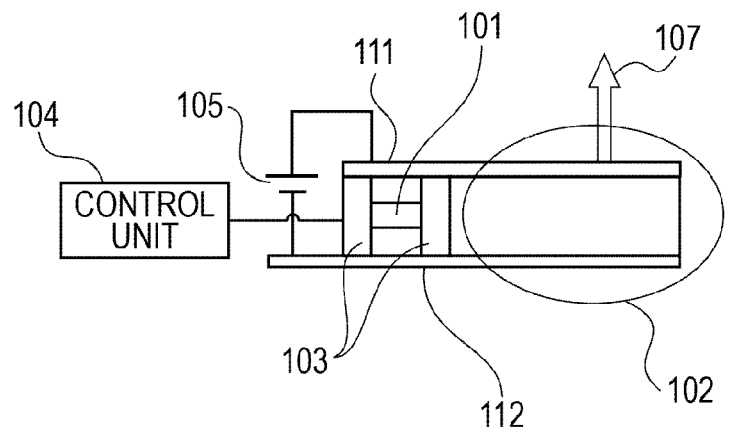

A terahertz wave generating device 100 according to an embodiment of the present invention is described below with reference to FIGS. 1A to 1C. FIGS. 1A to 1C are schematic illustrations of the present embodiment. An active layer 101 generates terahertz waves using intersubband transition of a carrier. It is desirable that the active layer be a device that generates a negative differential resistance. It is more desirable that the active layer 101 have a resonant tunneling structure (or a resonant tunneling diode (hereinafter referred to as an "RTD 101")). It is still more desirable that the RTD 101 be structured so as to be sandwiched by a first electrode 111 and a second electrode 112. In this way, a voltage can be applied to the RTD 101 (or a voltage can be generated) by using a power supply (or a voltage applying unit) 105.

The RTD 101 is a diode having a semiconductor heterostructure in which a barrier layer and a quantum well layer are alternately stacked. A negative differential resistance appears in the current-voltage characteristic due to a resonant tunneling phenomenon. For example, a triple-barrier quantum well structure including InGaAs/InAlAs/AlAs, which is epitaxially grown on InP, is used as the RTD 101. Examples of the structure of the RTD 101 further include a widely used double-barrier structure and a multiple barrier structure. Examples of the material of the RTD 101 include a GaAs-based material and an Si-based material. Such a structure and a material can be appropriately selected in accordance with a desired oscillation frequency and the desired output. While the present invention is described with reference to an electron serving as a carrier, the present invention is not limited thereto. For example, a hole can be employed as a carrier.

A resonator unit 102 (an electromagnetic wave resonator) resonates the terahertz waves generated by the RTD 101. The resonator unit 102 mainly resonates electromagnetic waves (terahertz waves) so as to magnify the power of the electromagnetic waves. In addition, the resonator unit 102 forms an LC resonant circuit together with the RTD 101 and determines the fundamental oscillation frequency. The resonator unit 102 is electrically connected to the RTD 101 via an ohmic electrode (a first electrode 111 and a second electrode 112). A voltage is applied to the RTD 101 by a power supply 105.

It is desirable that the resonator unit 102 include a radiation unit for radiating resonant terahertz waves 107. At that time, the resonator unit 102 includes the radiation unit so that the electromagnetic waves are more efficiently retrieved (or radiated) into a space. In addition, it is desirable that the radiation unit be negligibly affected by deformation due to the stress. In this way, a change in a radiation pattern of the electromagnetic waves caused by deformation of a member due to the stress and a change in the radiation efficiency do not occur. Accordingly, the resonator unit 102 can reliably radiate the terahertz waves 107. However, like a patch antenna (described in more detail in a first embodiment, refer to a patch antenna 202 shown in FIG. 2), a resonator unit and a radiation unit may be integrated into a single unit.

For example, the resonator unit 102 may have a slot antenna structure that can easily handle a high frequency, a coplanar line structure that can be easily arrayed, or a three-dimensional hollow waveguide that has a high Q value. Alternatively, if a resonator having a metal-metal plasmon waveguide structure is used as the resonator unit 102, higher power can be output.

A strain generating unit 103 generates strain (also referred to as "stress") of the active layer 101. The strain generating unit 103 is also referred to as a "stress generating unit 103". The strain generating unit 103 is described in more detail below.

A control unit 104 controls the strain generating unit 103 in accordance with the oscillation characteristic (the frequency or the power) of the terahertz waves resonated by the resonator unit 102. At that time, since the negative differential resistance is varied in accordance with the strain of the active layer 101, the frequency or the power of the terahertz waves 107 resonated by the resonator unit 102 is varied. More specifically, when strain (stress) occurs in the active layer 101, the crystal structure of the active layer 101 is changed. Therefore, the effective mass of an electron of the active layer 101 is changed. Thus, the drift velocity is changed (since the drift velocity is a function of the effective mass). In this way, the negative differential resistance is varied (since the negative differential resistance is a function of the drift velocity). Accordingly, the frequency of the terahertz waves 107 (a function of the negative differential resistance) can be varied.

Figure 3A:
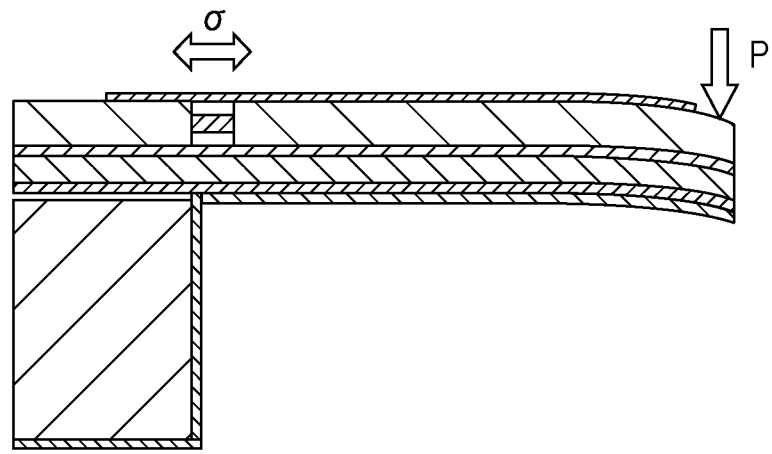
FIGS. 3A and 3B are schematic illustrations of a direction in which a stress occurs according to the first embodiment.
Figure 3B:
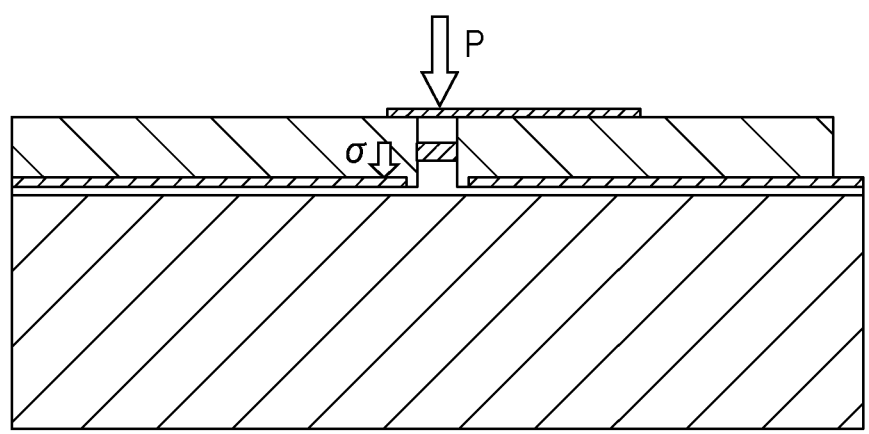

In this case, it is desirable that the strain generating unit 103 receive energy, such as electricity or heat, introduced thereinto. At that time, it is desirable that the active layer 101 include a stress signal source for generating a strain signal 106 (also referred to as a "drive unit" for driving the strain generating unit 103). The strain signal 106 is used to generate a stress in the active layer 101. In general, in order to transmit the strain signal 106 to the RTD 101, a cantilever structure or a membrane structure is employed. For example, as shown in FIGS. 3A and 3B, a stress is externally and directly applied. Alternatively, an internal longitudinal stress or lateral stress can be generated in the RTD 101 by using a piezoelectric property of the member or an inner stress change in the member.

Strain Generating Unit 103

A modification of the strain generating unit 103 included in a terahertz wave generating device according to the present embodiment is described with reference to FIGS. 1B and 1C.

(1) Deflectable Structure

In FIG. 1B, the strain generating unit 103 is configured so as to be deflectable. At that time, it is desirable that the RTD 101 be disposed at a position at which strain occurs in the in-plane direction of the RTD 101 when the strain generating unit 103 is bent.

An example of the strain generating unit 103 is described next with reference to FIG. 2. The strain generating unit 103 has a piezoelectric unimorph-structure 212 including a piezoelectric thin film and a metal thin film and a cantilever structure 213. As used herein, the term "unimorph" refers to a piezoelectric transducer formed from a piezoelectric flake bonded to a metal flake. When displacement occurs so that one piezoelectric element is extended and the other piezoelectric element is compressed, a stress occurs at the fulcrum. Since a piezoelectric material has a response higher than that used in a mechanical stress generating method, the strain signal 106 can be input to the RTD 101 (an RTD 201 in FIG. 2) at high speed.

The piezoelectric unimorph-structure 212 includes a piezoelectric layer 214 and a stress signal electrode 215. The stress signal electrode 215 is connected to a stress signal source 219. By applying a voltage having appropriate level and polarity to the piezoelectric layer 214, a tensile stress or a compressive stress occurs in the cantilever structure 213. Thus, the cantilever structure 213 is deformed. The stress signal source 219 is connected to an adjustment unit 220 (corresponding to the control unit 104 in FIG. 1A). The adjustment unit 220 performs adjustment so that a desired stress signal is input to the RTD 101. The RTD 201 is disposed at a stress concentration point of the cantilever structure 213. Upon receiving the signal from the stress signal source 219, the RTD 201 generates an inner stress in a direction substantially parallel to a heterojunction interface (a lateral stress). In this way, as shown in FIG. 3A, a stress σ in the in-plane direction of the RTD 201 (a lateral stress) can be generated. Note that FIG. 3A is a partial enlarged view of FIG. 2.

Like the present embodiment, it is desirable that the RTD 101, the resonator unit 102, and the strain generating unit 103 be disposed and integrated in the same substrate. In this way, a compact terahertz electromagnetic wave generating device can be realized.

(2) Piezoelectric Field Generatable Structure

In FIG. 1C, the strain generating unit 103 is configured so as to be capable of generating piezoelectric field.

It is desirable that the RTD 101 be disposed at a position at which a stress occurs in a direction perpendicular to the in-plane direction of the RTD 101 when the strain generating unit 103 generates piezoelectric field. Thus, as shown in FIG. 3B, a stress σ in a direction perpendicular to the in-plane direction of the RTD 101 (a longitudinal stress) can be generated.

This example employs a method using electrical power as the energy and using a bimorph piezoelectric element as a strain generating unit. As used herein, the term "bimorph piezoelectric element" refers to an element formed by laminating two piezoelectric elements (a lead zirconate titanate element or a barium titanate element) in order to increase the level of displacement per applied voltage.

(3) Other Structures

Other examples of a strain generation unit can employ the following methods. A method in which a stress is generated in a resonant tunneling diode of the strain generation unit using a stylus (e.g., a probe) can be employed. By hitting a portion in the vicinity of the resonant tunneling diode (e.g., an electrode) and generating a force, a stress can be generated in the resonant tunneling diode.

Alternatively, a method in which heat is used as the energy and a bimetal (two metal plates having different coefficients of thermal expansion bonded to each other) is used can be employed. Still alternatively, a method using a residual stress of a thin film can be employed.

Yet still alternatively, a method using an electromagnetic actuator, an MEMS electrostatic actuator, surface acoustic waves, or acoustic waves can be suitably employed. Yet still alternatively, a configuration in which an RTD is disposed at a stress concentration point of a membrane structure and a stress is generated in the membrane structure using a variation in the pressure of liquid or gas flowing in an enclosed flow passage can be employed.

Descriptions of Principal of Electromagnetic Wave Oscillation and Operation for Varying Frequency by Varying Stress In general, as described in, for example, APL, Vol. 55 <17>, p. 1777, 1989, an RTD is expressed using an equivalent circuit shown in FIG. 4A. In addition, the fundamental oscillation wavelength of an electromagnetic wave oscillator is determined by the resonant frequency of an LC of a resonant circuit in which a load resistance, a capacitance component, and an inductance component determined by the configuration of a resonator are connected to one another. In FIG. 4A, $R_{cont}$ and $C_{cont}$ represent a contact resistance component and a contact capacitance component between a contact electrode and a contact layer, respectively. $R_{post}$ represents a resistance component due to the mesa structure connected in series to the RTD. In addition, $R_{act}$ represents a negative differential resistance of the RTD (<0). Furthermore, $C_{act}$ represents the capacitance component of the RTD, and $L_{act}$ represents the inductance component of the RTD.

$L_{act}$ indicates a delay time $\tau$ of an electron in an RTD 101 in relation to the tunneling time of the electron in the RTD and a traveling time in the depletion layer of the RTD in the form of a delay inductance. $L_{act}$ is expressed as follows:

$$L_{act} = R_{act} \times \tau$$

In contrast, for example, NPL 1 describes that when a stress occurs in a resonant tunneling diode, variations in a piezoelectric field effect and the effective mass of an electron occur in the heterostructure, in general. As a result, as shown in FIG. 4B, a peak/valley voltage and current is shifted in the I-V characteristic and, therefore, the negative differential resistance varies.

According to the present embodiment, the terahertz electromagnetic wave generating device exhibits the negative differential resistance (NDR) as shown in FIG. 4B when a bias voltage is input from the power supply 105 to the RTD 101. In addition, when the stress signal σ is input from a stress generating unit to the RTD 101, the value $R_{act}$ of the negative differential resistance (NDR) varies in accordance with the stress signal σ, as shown in FIG. 4C.

Accordingly, at a certain bias voltage V, by changing the level of the input stress signal σ, the value $R_{act}$ of the negative differential resistance (NDR) can be changed. Thus, the delay inductance $L_{act}$ of the equivalent circuit shown in FIG. 4A is changed. As a result, even when the same electromagnetic resonator is used, the resonant frequency of the resonant circuit can be significantly changed by changing $L_{act}$. Accordingly, the resonant frequency of the terahertz electromagnetic wave generating device can be changed.

FIG. 4C illustrates an example of a change in the oscillation frequency in accordance with a change in stress occurring in the electromagnetic wave generating device (the mesa diameter of the RTD: 2 μmΦ, a patch antenna) according to the first embodiment of the present invention. In this example, a change in the above-described LC resonant frequency is estimated using the equivalent circuit.

As described above, according to the present invention, the terahertz electromagnetic wave generating device is configured to be capable of controlling the oscillation frequency using a change in the negative differential resistance caused by the externally input strain signal 106. However, it should be noted that the present invention is not limited to the above-described configuration.

Strain Direction in RTD and Crystal Plane Orientation

It is desirable that the active layer 101 be formed using at least two types of semiconductor heterojunction.

At that time, it is desirable that a stress be generated in the direction of the interface of the heterojunction (a direction substantially parallel to the interface) (i.e., lateral stress). In such a case, a piezoelectric field effect appears in the heterostructure regardless of the crystal plane direction and, therefore, a change in the negative differential resistance is significant. Accordingly, the frequency can be efficiently changed.

In addition, it is desirable that a stress be generated in a direction substantially perpendicular to the interface of the heterojunction (a longitudinal stress). At that time, a change in the effective mass mainly occurs in the (100) crystal plane direction, and a change in the effective mass and a piezoelectric field effect mainly occur in the (111) crystal plane direction. Thus, the frequency can be varied.

If an RTD having a semiconductor heterosructure that is epitaxially grown in the (111) crystal plane direction is employed, a significant piezoelectric field effect can be obtained. Accordingly, the frequency can be efficiently varied.

The torsional stress can generate a lateral stress and a longitudinal stress at the same time. In addition, the torsional stress can cause a change in inductance. Accordingly, the frequency can be efficiently varied.

Note that even a stress generating unit that combines a biaxial stress and a uniaxial stress can sufficiently vary the frequency. It should be noted that the present invention is not limited to the above-described structure.

Switch for Switching Bias Polarity

An RTD that provides a negative differential resistance varying in accordance with a positive/negative bias voltage may be employed, and a changeover switch for switching the polarity may be provided to the bias power supply. For example, when bias voltages having different polarities are input from the bias power supply to the RTD shown in FIG. 4B, two types of negative differential resistance in the form of positive and negative voltage signals can be obtained. In addition, if a stress signal is input by using the stress generating unit according to the present invention, the negative differential resistance varies. By using such a characteristic and by varying at least two oscillation frequencies obtained using the polarity of the bias voltage using the stress signal, the frequency can be varied in at least two frequency bands.

Device Arraying

If a plurality of the terahertz wave generating devices 100 are arrayed on the same substrate, a terahertz wave generating device that can generate terahertz electromagnetic waves having different frequencies is realized in the form of a one-chip device. Alternatively, by using a substrate having stress distribution in the plane and arranging the devices in accordance with the stress distribution in an array, terahertz electromagnetic waves having different frequencies may be generated.

Embodiments of the present invention are described below.

EMBODIMENTS

First Embodiment

Resonant Tunneling Diode

A terahertz wave generating device 200 according to the present embodiment is described with reference to FIG. 2. FIG. 2 is a schematic illustration of a terahertz wave generating device according to the present embodiment. FIG. 4A illustrates an equivalent circuit of an RTD. FIG. 4B illustrates the current-voltage characteristic of the terahertz wave generating device 200 according to the first embodiment.

The terahertz wave generating device 200 includes the RTD 201, the patch antenna 202, a stress generating unit 230, the adjustment unit 220, and a bias power supply 218. The terahertz wave generating device 200 has a patch antenna resonator structure for an electromagnetic wave resonator and a cantilever structure using a piezoelectric unimorph effect for the stress generating unit 230 (corresponding to the strain generating unit 103 shown in FIG. 1A). Such a configuration and a structure can be produced by using an existing semiconductor process.

Description of RTD

The RTD 201 has a triple-barrier quantum well structure including an InGaAs/InAlAs/AlAs heterojunction and a contact layer including heavily Si-doped n+ and InGaAs laminated vertically. The layer structure of the triple-barrier quantum well structure according to the present embodiment is as follows:

| First barrier layer | AlAs | 1.3 nm |
| First quantum well layer | InGaAs | 7.6 nm |
| Second barrier layer | InAlAs | 2.6 nm |
| Second quantum well layer | InGaAs | 5.6 nm |
| Third barrier layer | AlAs | 1.3 nm | where the first quantum well layer, the second barrier layer, and the second quantum well layer are InGaAs/InAlAs lattice-matched to an InP substrate having the (100) plane orientation. In contrast, the first barrier layer and the third barrier layer is AlAs not lattice-matched to an InP substrate. Each of the first barrier layer and the third barrier layer is thinner than a critical film and is a high-energy barrier layer.

An epitaxial semiconductor layer including the RTD 201 is transferred to a substrate 216 (a silicon substrate) using the Au—Au thin film bonding method using plasma activation and heat press bonding.

FIG. 4B is a graph indicating the measured current-voltage characteristic of the RTD 201 used in the present embodiment. By applying two types of bias voltage having different polarities to the RTD 201, the RTD 201 exhibits two negative differential resistance regions having different peak current densities and different peak to valley ratios.

For the RTD 201 according to the present embodiment, when the level of the stress signal is 0 MPa and if a positive bias is applied, the peak current density $J_p=280$ kA/cm$^2$. When the diameter of the RTD 201 is about 2 µmΦ, the negative differential resistance NDR=−22Ω. When a negative bias is applied, the peak current density $J_p=90$ kA/cm$^2$. When the diameter of the RTD 201 is about 2 µmΦ, NDR=−174 Ω.

While the present embodiment has been described with reference to a triple-barrier resonant tunneling diode including InGaAs/InAlAs and InGaAs/AlAs that are grown on an InP substrate having the (100) plane orientation, the structure and material are not limited thereto. Even a combination of another structure and another material can provide a terahertz electromagnetic wave generating device according to the present invention. For example, a resonant tunneling diode having a double barrier quantum well structure or a resonant tunneling diode having a multiple barrier quantum well structure (higher than triple barrier quantum well structure) may be employed. In addition to the plane orientation (100), an RTD having (111) growth that provides a significant change in the negative differential resistance with respect to a longitudinal stress and a lateral stress can be employed. In such a case, the frequency can be more efficiently varied. As the materials, GaAs/AlGaAs, GaAs/AlAs, or InGaAs/GaAs/AlAs formed on a GaAs substrate, InGaAs/AlGaAsSb formed on an InP substrate, InAs/AlAsSb or InAs/AlSb formed on an InAs substrate, or SiGe/SiGe formed on an Si substrate may be employed.

Description of Electromagnetic Wave Resonator

According to the present embodiment, in the patch antenna resonator structure, the patch antenna 202 functions as an electromagnetic wave resonator unit 203 and an electromagnetic wave radiation unit 204. That is, by using the patch antenna 202, terahertz waves can be efficiently retrieved into a space.

The patch antenna 202 includes the RTD 201, an upper electrode layer 211, a GND electrode layer 208, and a dielectric layer 207. The electromagnetic waves resonate in the dielectric layer 207 located in a region between the upper electrode layer 211 and the GND electrode layer 208. For such a resonator structure, the material and the thickness of the dielectric layer 207, the length of a side of the patch antenna 202, and the size and position of the RTD 201 are key factors for determining the oscillation frequency.

According to the present embodiment, the patch antenna 202 includes the upper electrode layer 211 having a square pattern of a size of 200 µm×200 µm. In addition, the RTD 201 is disposed at a position shifted from the center of the antenna in a A'-A direction by 40 µm. The RTD 201 is vertically sandwiched by the upper electrode layer 211 and the GND electrode layer 208. Thus, a bias voltage needed for driving the RTD 201 can be applied to the RTD 201. The RTD 201 has a 2-µm mesa structure including a quantum well structure.

The upper electrode layer 211 is formed by lifting off a vacuum-deposited Ti/Pd/Au layer (20 nm/20 nm/200 nm). The Ti/Pd/Au layer is known as a heavily doped InGaAs low-resistance contact electrode. BCB (Benzocyclobutene) known as a low-loss material for high-frequency electromagnetic waves is used for the dielectric layer 207. The thickness of the BCB film of the dielectric layer 207 is 3 µm. The dielectric layer 207 is formed by using a spin coat method and a dry etching method. The GND electrode layer 208 serves as a ground electrode in the resonator and a bonding layer when the active layer including the RTD 201 is bonded to the substrate 216. In the present embodiment, a Ti/Pd/Au/Ti layer (20 nm/20 nm/200 nm/20 nm) formed by using a sputtering method is used.

By using the patch antenna 202 having the above-described structure and configuration and the RTD 201, design is performed so that electromagnetic oscillation of a fundamental oscillation frequency of 420 GHz is obtained when the stress signal is 0 MPa.

Description of Stress Generating Unit

The stress generating unit 230 includes the piezoelectric unimorph-structure 212 and the cantilever structure 213. The RTD 201 is disposed at a stress concentration point of the cantilever structure 213. The piezoelectric unimorph-structure 212 includes the piezoelectric layer 214 and the stress signal electrode 215. A 1-µm-thick aluminum nitride thin film formed using a sputtering method is used as the piezoelectric layer 214. A 0.5-µm-thick aluminum thin film formed using a sputtering method is used as the stress signal electrode 215.

The cantilever structure 213 includes the substrate 216 and a beam structure layer 217. Silicon having an excellent workability and elasticity is used for the substrate 216 (the thickness: 525 µm). In addition, a 1-µm-thick silicon nitride film formed using a plasma CVD method is used as the beam structure layer 217.

The cantilever structure 213 is formed by dry-etching silicon serving as a base material of the substrate 216 having the RTD 201 transferred thereonto using a photolithography method and an SiDeepRIE method using a Bosch process. After the cantilever structure 213 is formed, the piezoelectric unimorph-structure 212 is formed using a sputtering method or a liftoff method.

According to the present embodiment, the stress generating unit 230 can apply, to the RTD 201, a lateral stress (parallel to the heterojunction interface) of 0 MPa to about 1000 MPa.

Note that any normal piezoelectric material can be used as the material of the piezoelectric layer 214. Examples of the forming method include a sputtering method, a vacuum deposition method, a laser ablation method, an ion plating method, a CVD method, and an MOCVD method. One of these methods can be employed depending on the intended use. Examples of the material include aluminum nitride, zinc oxide, polyvinylidene fluoride, lead zirconate titanate (PZT), lead titanate, lithium niobate, tantalum niobate, and strontium titanate. Examples of the material further include gallium nitride, indium nitride, beryllium oxide, zinc oxide, cadmium sulfide, zinc sulfide, and silver iodide. It is desirable that the thickness of the piezoelectric layer 214 be in the range from 0.1 μm to 10 μm so that the stress generating unit 230 outputs sufficient power and cracking or peeling-off negligibly occurs. Any material having conductivity can be used for the stress signal electrode 215. An example of the material can be widely used metal, such as aluminum, nickel, chrome, copper, titanium, molybdenum, platinum, gold, or palladium. Examples of the forming method include a sputtering method and a vacuum deposition method. Any material can be used for the substrate 216 depending on the intended use. Alternatively, an indium phosphide substrate, a gallium arsenic substrate, a glass substrate, a ceramic substrate, or a resin substrate can be employed. Similarly, any material can be used for the beam structure layer 217 depending on the intended use. Examples of the material include a thin film of silicon, a polysilicon thin film, a gallium arsenic thin film, an indium phosphide thin film, an indium gallium arsenide thin film, a resin thin film, and a silicon oxide thin film.

Description of Connection to Control System and Operation

The resonant circuit including the RTD 201 and the electromagnetic wave resonator (the patch antenna) 202 is connected to the bias power supply 218. A bias voltage is input to the resonant circuit.

The stress signal electrode 215 is connected to the stress signal source 219. When a voltage having appropriate level and polarity is applied to the piezoelectric layer 214, a tensile stress or a compressive stress is applied to the cantilever structure 213. Thus, the cantilever structure 213 is deformed.

The RTD 201 is disposed at the stress concentration point of the cantilever structure 213. When the cantilever structure 213 is deflected, an internal stress that is substantially parallel to the heterojunction interface occurs in the RTD 201.

The adjustment unit 220 is connected to the bias power supply 218 and the stress signal source 219. The adjustment unit 220 externally controls the bias voltage and the stress signal input to the RTD 201 so that the bias voltage and the stress signal have desired values in accordance with the oscillation frequency.

According to the present embodiment, in the terahertz electromagnetic wave generating device 200, NDR=−22Ω when the stress signal is 0 MPa and the bias voltage is 0.8 V. At that time, the terahertz electromagnetic wave generating device 200 performs a terahertz electromagnetic wave oscillation operation at a fundamental oscillation frequency of 455 GHz.

When a tensile stress and a compression stress in the range of 0 to 500 MPa is input to the RTD 201 as a stress signal, the NDR and the fundamental oscillation frequency vary, as shown in FIG. 4C.

As described above, according to the present embodiment, the terahertz electromagnetic wave generating device 200 can vary the frequency by inputting a stress signal and varying the negative differential resistance. In addition, by modulating the input method of the stress signal, frequency modulation can be performed.

Second Embodiment

Application of Stress to RTD Using Piezoelectric Field

A terahertz electromagnetic wave generating device 300 according to the present embodiment is described below with reference to FIG. 5. FIG. 5 illustrates the structure according to a second embodiment of the present invention. Note that descriptions of the components of the structure that are similar to those of the first embodiment are not repeated.

The terahertz electromagnetic wave generating device 300 includes an RTD 301, a mesa 310, a microstrip patch antenna 302, a stress generating unit 303, an adjustment unit 320, a bias power supply 318, and a stress signal source 319. According to the present embodiment, a microstrip patch antenna resonator structure is employed as an electromagnetic wave resonator, and a structure in which a stress occurs by using a bimorph piezoelectric effect is employed as the stress generating unit 303. Such structures can be manufactured using an existing semiconductor process.

The microstrip patch antenna 302 includes a patch antenna 305 mainly serving as an electromagnetic wave resonator unit and an electromagnetic wave radiation unit and a microstrip line 304 mainly serving as an electromagnetic wave resonator unit. Like the first embodiment, the material and the thickness of a dielectric layer 307, the length of a side of the patch antenna 305, the length of the microstrip line 304, and the size and position of the RTD 301 are key factors for determining the fundamental oscillation frequency. The present embodiment has the following design. The upper electrode layer 311 of the patch antenna 305 has a rectangular shape having a size of L×L/2, where L=280 μm. In addition, the microstrip line 304 having a line width of 8 μm extends from the middle point of the short side of the patch antenna 305 and forms a T shape above the RTD 301. In this case, the RTD 301 is disposed at a position corresponding to the antinode of the oscillating electromagnetic waves of the microstrip line 304. The microstrip line 304 is connected to a DC power supply line 325 and is connected to the bias power supply 318 via a pat electrode 326. Like the first embodiment, the RTD 301 has a 2-μmΦ mesa structure. The RTD 301 is vertically sandwiched by an upper electrode layer 311 and a GND electrode layer 308. In this way, a bias voltage required for driving the RTD 301 can be applied to the RTD 301. Note that the materials of the upper electrode layer 311, the GND electrode layer 308, and the dielectric layer 307 are the same as those in the first embodiment. The microstrip patch antenna 302 having the above-described structure and configuration induces electromagnetic wave oscillation at a fundamental oscillation frequency of 340 GHz when the stress signal is 0 MPa.

According to the present embodiment, the stress generating unit 303 has a structure that generates a stress using a bimorph piezoelectric effect. The stress generating unit 303 includes a piezoelectric layer 314, a piezoelectric layer 315, and a stress signal electrode 313 sandwiched by the piezoelectric layers 314 and 315. The stress generating unit 303 is disposed so as to cover the RTD 301.

The piezoelectric layer 314 and the piezoelectric layer 315 are piezoelectric members each polarized in the layer thickness direction. For example, the piezoelectric layer 314 and the piezoelectric layer 315 are 1-μm-thick aluminum nitride thin films formed by a sputtering method. In addition, the stress signal electrode 313 is a 0.5-μm-thick aluminum thin film formed by using a vacuum deposition method. The stress signal electrode 313 is connected to the stress signal source 319 via a stress signal wiring 316 and a stress signal pat 312. The stress signal wiring 316 is electrically insulated from an InP substrate 321 by an insulating layer 317. When a voltage signal, for example, is applied from the stress signal source 319, an internal stress occurs in a direction indicated in the drawing and, therefore, a stress signal is applied to the RTD 301.

In the RTD 301 according to the present embodiment, deformation of the patch antenna 305 caused by application of a stress signal to the RTD 301 does not occur. Accordingly, even when the frequency is varied due to application of a stress, the radiation direction remains unchanged. Thus, radiation in a certain radiation direction can be reliably realized.

Third Embodiment

Resonator with Slot Antenna Structure

Figure 6:
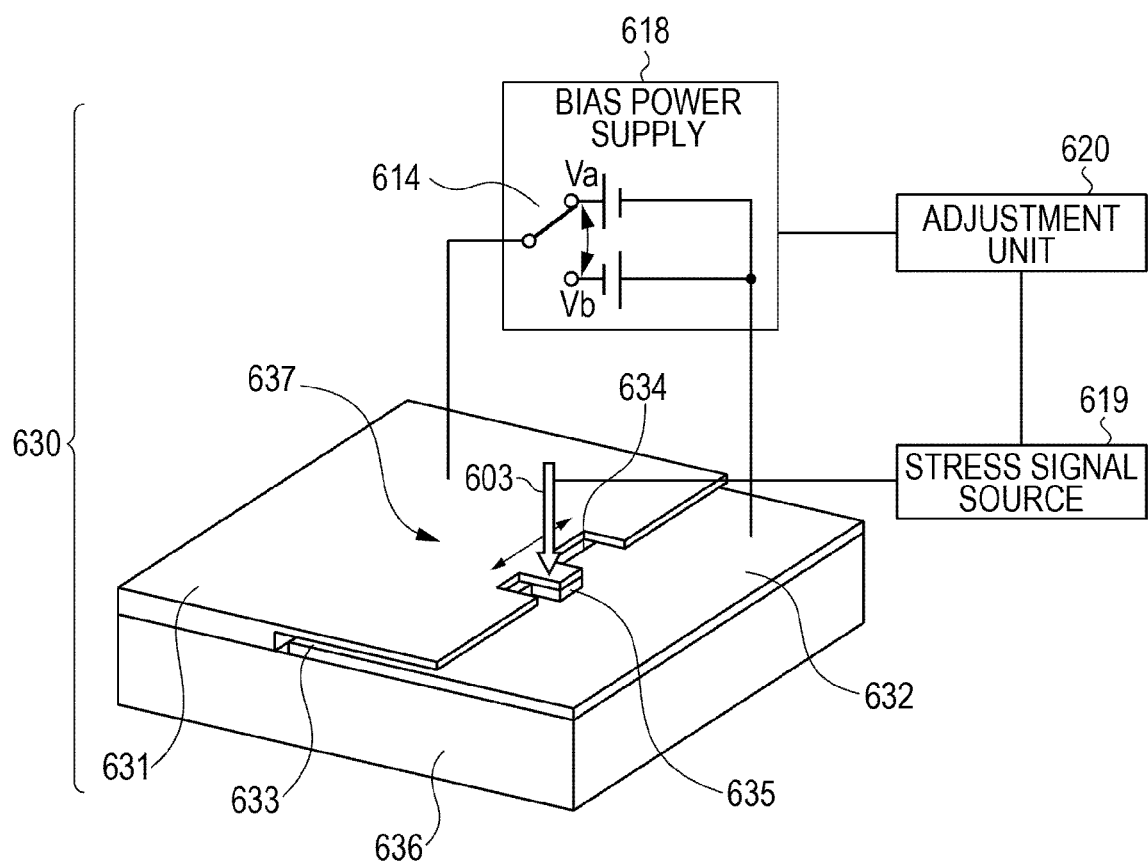
FIG. 6 is a schematic illustration of the configuration of a terahertz wave generating device according to a third embodiment of the present invention.

For example, as an electromagnetic wave generating device 630 shown in FIG. 6, an electromagnetic wave generating device including an electromagnetic wave resonator having a slot antenna structure and a stress generating unit 603 using an external and direct application method can be employed. A slot antenna 637 is suitable for obtaining a higher frequency for the electromagnetic wave generating device according to the present invention. In addition, as the electromagnetic wave generating device 630, a switch 614 that switches between positive and negative biases ($V_a$ and $V_b$) may be disposed.

The electromagnetic wave generating device 630 has a structure in which Ti/Pd/Au electrode layers 631 and 632 are laminated on an InP substrate 636 with a $SiO_2$ insulating layer 633 therebetween. A window region 634 in which part of the electrode layer 631 and part of the electrode layer 632 are removed functions as a slot antenna resonator. The length of the window region 634 is a factor for determining the oscillation frequency. According to the present embodiment, the window width of the slot antenna 637 is 30 μm. A mesa 635 having a side of 2.3 μm is disposed. The mesa 635 is formed from the post-like RTD 101. Each of the Ti/Pd/Au electrode layers 631 and 632 is an ohmic electrode and is connected to an adjustment unit 620 via a bias power source 618. In addition, the stress generating unit 603 directly generates a stress in the RTD 101 using a sharp-pointed probe or anvil. The stress generating unit 603 is connected to the adjustment unit 620 via a stress signal source 619. Thus, a stress signal can be input in accordance with a desired frequency.

Another example of the stress generating unit is a torsion bar that is deflected by an electrostatic force received from an electrostatic coil. In such a case, the RTD 101 and the electromagnetic wave resonator are disposed at a stress concentration point of the torsion bar. Thus, a stress generated when the torsion bar is twisted due to the electromagnetic force from the coil is transferred to the RTD 101. Alternatively, the stress generating unit may have a structure in which the radiation direction is changed by using deformation of a torsion bar and changing the direction of the slot antenna 637 using the stress signal.

Fourth Embodiment

Inspection Apparatus

Figure 7A:
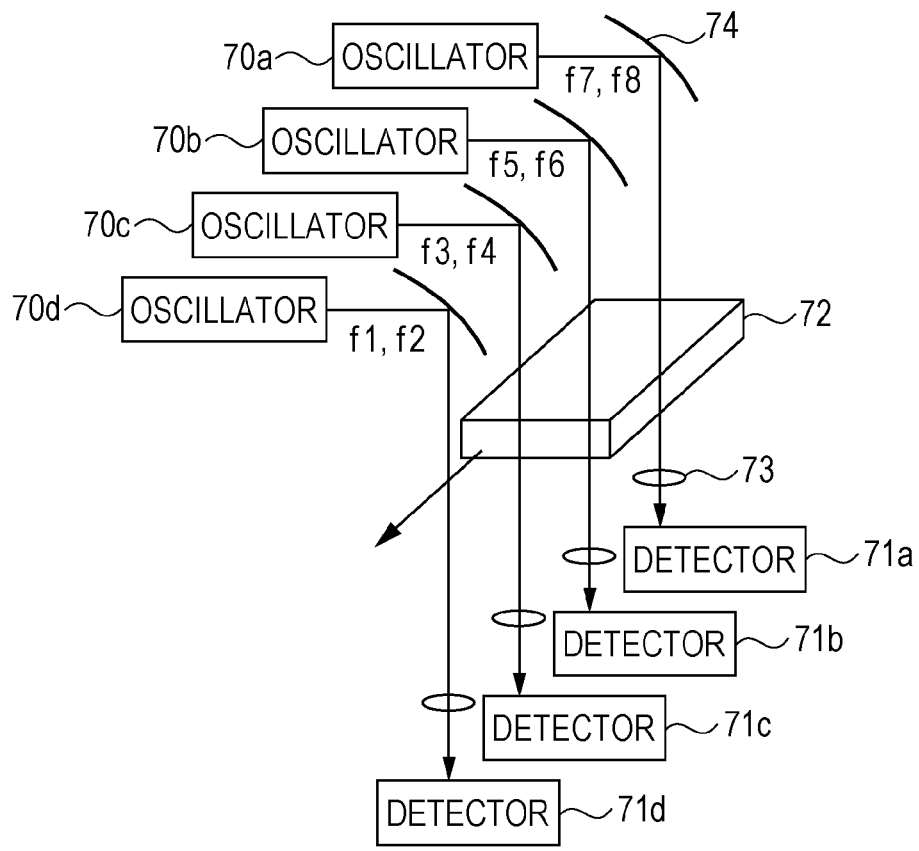
FIGS. 7A and 7B are schematic illustrations of an inspection apparatus according to a fourth embodiment of the present invention.
Figure 7B:
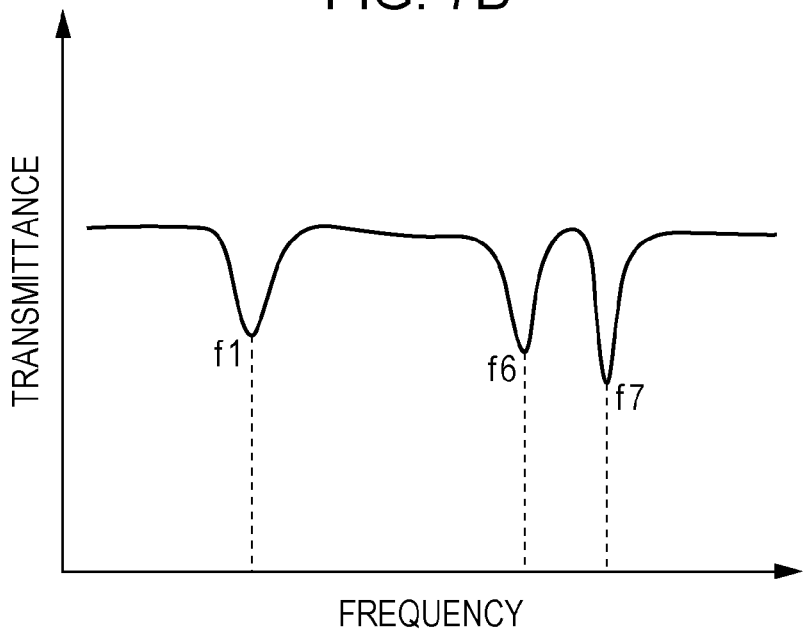

A fourth embodiment is described next with reference to FIGS. 7A and 7B. According to the present embodiment, for example, an object inspection apparatus including an electromagnetic wave generating device using the resonant tunneling diode according to the present invention is provided. The inspection apparatus includes, for example, electromagnetic wave generating devices 70a to 70d according to the above-described embodiment arranged therein. The electromagnetic wave generating devices 70a to 70d can vary the frequency. Thus, electromagnetic waves of a plurality of frequencies f1 to f8 are generated. In this example, each of the frequencies f1 to f8 can be varied or modulated by inputting a stress signal to one of the electromagnetic wave generating devices 70a to 70d or changing the polarity of the bias voltage using a switch. In addition, each of the electromagnetic waves is transformed into a parallel beam by a parabolic mirror 74 and propagates. The electromagnetic wave is emitted to an object 72 serving as an analyte. The transmission beam is collected by a lens 73 and is received by one of detectors 71a to 71d. While the present embodiment has been described with reference to a transmission arrangement, inspection may be made using a reflective arrangement. For example, a strong/weak combination pattern to be received by the detector is prestored in a storage unit. In addition, a test material has an absorption spectrum of one or more of the frequencies f1 to f8. In such a case, by comparing the absorption spectrum of the test material with the prestored pattern, it can be determined whether the test material is included in the object 72. In addition, FIG. 7B illustrates an example of a fingerprint spectrum of a test material. This spectrum has absorption peaks at frequencies f1, f6, and f7. Accordingly, by prestoring the absorption pattern of the test material and determining that the outputs of the detector are weak at the frequencies f1, f6, and f7 and the outputs of the detector are strong at the other frequencies, it can be determined that the test material is included.

The inspection apparatus according to the present embodiment can be used for, for example, inspection of dangerous goods and restricted material at airports, inspection of logistics (postal mails or cargos), or inspection of industrial products in factories. At that time, by using the electromagnetic wave generating device according to the present invention, inspection using a greater number of frequencies generated by a single inspection device becomes available. Thus, a greater number of types of test materials can be inspected.

Fifth Embodiment

Heterodyne Detector

Figure 8A:
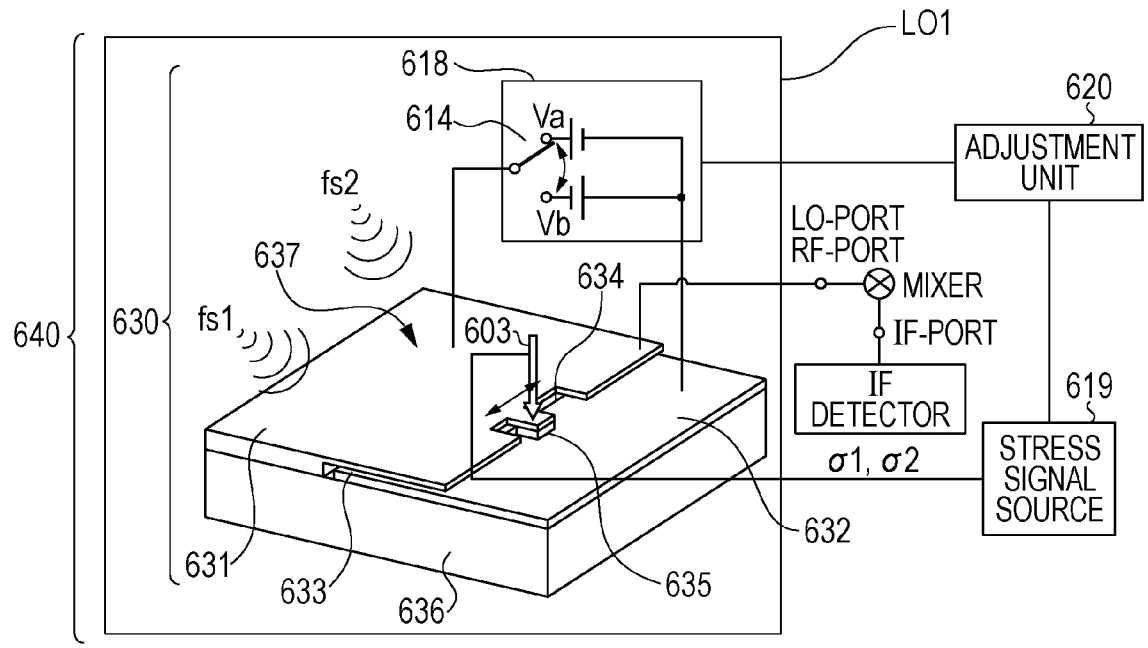
FIGS. 8A and 8B are schematic illustrations of a detector according to a fifth embodiment of the present invention.
Figure 8B:
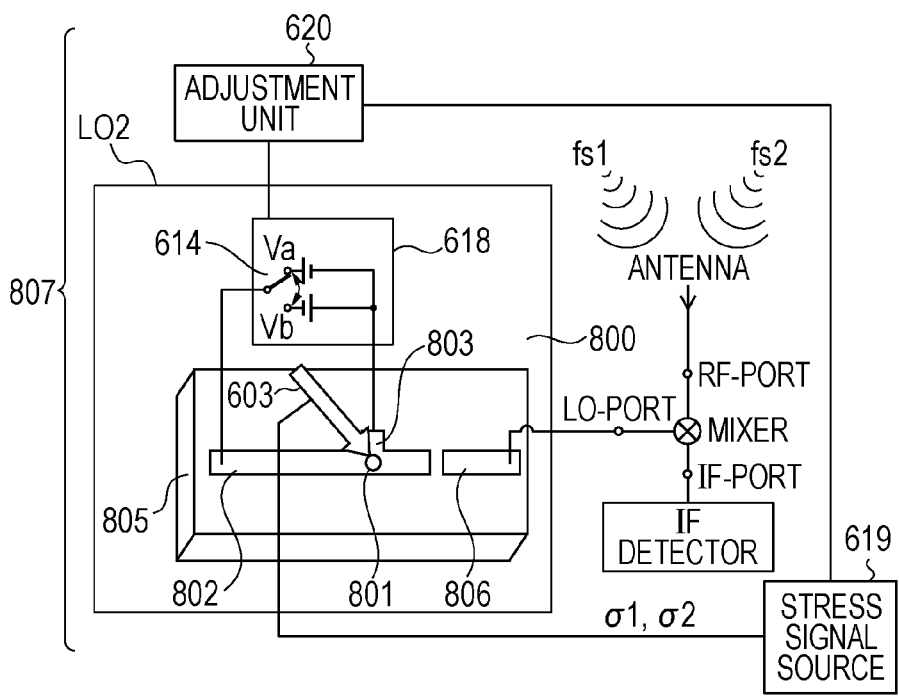

A fifth embodiment is described below with reference to FIGS. 8A and 8B. According to the present embodiment, for example, a heterodyne detector including an electromagnetic wave generating device using the resonant tunneling diode according to the above-described embodiment as a local oscillator is provided. FIG. 8A illustrates an example using a slot antenna electromagnetic wave resonator as a local oscillator. FIG. 8B illustrates an example using a microstrip electromagnetic wave resonator as a local oscillator.

According to the present embodiment, the detector includes a local oscillator (LO), a mixer, an IF detector, an antenna, an LO-port, an RF-port, and an IF-port. In this example, the electromagnetic wave oscillator according to the present invention is used as the local oscillator (LO). The mixer is a device that efficiently converts the RF power into the IF power. For example, a shotkey diode, a superconductive SIS mixer, a hot-electron bolometer, or an HBT/HEMT mixer is used as the mixer. The IF detector detects an intermediate frequency (IF) output generated by mixing, and the antenna (Antenna) receives electromagnetic waves to be detected. The Lo-port and the RF-port serve as input ports of local oscillation waves and signal waves to the mixers (Mixer), respectively. The IF-port serves as an input port of the intermediate frequency (IF) to the IF detector. If a high-frequency filter and an RF amplifier (neither are shown) are provided between the antenna and the mixer and between the mixer and the local oscillator (LO1 or LO2), a more sensitive detector can be realized.

The detector according to the present invention is described in more detail below with reference to FIG. 8A. A local oscillator (LO1) of a detector 640 includes an electromagnetic wave generating device 630 including the slot antenna 637 and a bias power supply 618 including the switch 614. The electromagnetic wave generating device according to the present invention can change and modulate the frequency when stress signals ($\sigma_1$ and $\sigma_2$) are input. In addition, by switching the polarity of the bias voltage, electromagnetic waves of at least two frequencies can be generated. Accordingly, by using the electromagnetic wave generating device according to the present invention as the local oscillator (LO1), the frequencies in a wide bandwidth (e.g., from $f_L 1$ to $f_L 2$) can be input from a single local oscillator to the detector. In addition, in the detector 640, the slot antenna resonator structure 637 serves as an antenna for receiving the electromagnetic waves (from $f_s 1$ to $f_s 2$). The received electromagnetic waves and the oscillation output of the electromagnetic wave generating device 630 are input to the mixer via the RF-port and the LO-port. Thus, an intermediate frequency (IF), which is a difference frequency component, is generated by frequency mixing. The generated intermediate frequency (IF) is detected by the IF detector via the IF-port.

The operation performed by the detector according to the present invention is described next. For example, when a bias voltage $V_a$ is applied from the bias power source 618 and the stress signal $\sigma_1$ is input from the stress signal source 619 to the electromagnetic wave generating device 630, the local oscillator (LO1) oscillates at a frequency of $f_L 1$. At that time, the detector 640 receives signal waves 1 having a frequency of $f_s 1$ ($=|f_L 1+f_{IF}|$) using the antenna. Thereafter, the detector 640 detects the intermediate frequency $f_{IF}$ output from the mixer using the IF detector. In this way, the signal waves 1 can be detected. In contrast, when the stress signal $\sigma_2$ is input to the electromagnetic wave generating device 630, the local oscillator (LO1) oscillates at a frequency of $f_L 2$. At that time, the detector 640 receives signal waves 2 having a frequency of $f_s 2$ ($=|f_L 2+f_{IF}|$) using the antenna. Thereafter, the detector 640 detects the intermediate frequency $f_{IF}$ output from the mixer using the IF detector. In this way, the signal waves 2 can be detected.

Alternatively, even when, as shown in FIG. 8B, an electromagnetic wave generating device 800 including a resonant tunneling diode and a microstrip resonator as a local oscillator is employed, detection can be made in a similar manner. In this case, the local oscillator LO2 of a detector 807 includes an RTD 801, a microstrip line 802, a $\Xi/4$ stub 803, a local oscillation wave output unit 806, a substrate 805, and a power supply 614. The local oscillator LO2 can be produced by using a widely used MMIC technology.

In either structure, the oscillation output of the local oscillator LO2 can be continuously varied from the frequency $f_L 1$ to the frequency $f_L 2$ in accordance with the stress signals $\sigma_1$ and $\sigma_2$. Accordingly, the detector 807 can receive electromagnetic waves at a frequency from $f_s 1$ to $f_s 2$ using the antenna, and heterodyne detection can be made.

For example, when the electromagnetic wave generating device according to the first embodiment is used as a local oscillator, the frequency $f_L 1$ can be tuned from 425 GHz to 465 GHz. Accordingly, if the intermediate frequency is set so that $f_{IF}=2$ GHz, the electromagnetic waves at a frequency $F_s 1$ of 427 GHz to 467 GHz can be detected.

In this way, if an oscillator using the resonant tunneling diode according to the present invention is used as a local oscillator in heterodyne mixing, a detector capable of detecting terahertz electromagnetic waves in a wide bandwidth by itself can be realized.

Furthermore, according to the present embodiment, since the detector can detect terahertz electromagnetic waves in a plurality of frequency bands, the size of the detector can be reduced, and a densely-packed detector can be easily produced. Still furthermore, if a plurality of detectors according to the present embodiment are arranged in an array, a compact highly-sensitive detector capable of detecting high-frequency electromagnetic waves of a plurality of frequencies can be realized.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-295443, filed Dec. 25, 2009, which is hereby incorporated by reference herein in its entirety.

The invention claimed is:

1. An oscillator for oscillating electromagnetic waves having a frequency from 30 GHz to 30 THz, comprising:
    an active layer configured to generate the electromagnetic waves by intersubband transitions of a carrier;
    a resonator unit configured to resonate the electromagnetic waves generated by the active layer;
    a strain generating unit configured to generate strain of the active layer; and
    a control unit configured to control the strain generating unit in order to change an oscillation characteristic of the electromagnetic waves resonated by the resonator unit,
    wherein the oscillation characteristic of the electromagnetic waves resonated by the resonator unit is varied in accordance with a variation in a negative differential resistance of the active layer varied in accordance with the strain occurring in the active layer.

2. The oscillator according to claim 1, wherein the active layer is formed by a heterojunction of at least two types of semiconductor, and wherein strain is generated in the active layer by the strain generating unit in a direction of an interface of the heterojunction or in a direction substantially perpendicular to the interface.

3. The oscillator according to claim 1, wherein the strain generating unit is deflectable, and wherein the active layer is disposed at a position at which strain of the active layer is caused by deflection of the strain generating unit in an in-plane direction of the active layer.

4. The oscillator according to claim 1, wherein the strain generating unit is capable of generating piezoelectric field, and wherein the active layer is disposed at a position at which strain of the active layer is caused in a direction substantially perpendicular to an in-plane direction of the active layer by the piezoelectric field generated by the strain generating unit.

5. The oscillator according to claim 1, wherein an effective mass of an electron in the active layer is changed by strain of the active layer caused by the strain generating unit.

6. The oscillator according to claim 1, wherein the active layer is formed from a resonant tunneling diode, and wherein the resonant tunneling diode is capable of receiving a voltage applied thereto and radiating the electromagnetic waves resonated by the resonator unit.

7. The oscillator according to claim 6, wherein the resonator unit includes a radiation unit configured to radiate the electromagnetic waves.

8. The oscillator according to claim 1, further comprising a bias power supply configured to supply a bias voltage to the active layer and wherein the control unit controls the bias power supply.

9. The oscillator according to claim 8, wherein the control unit controls the oscillation characteristic of the electromagnetic waves by controlling the strain generating unit and the bias power supply.

10. The oscillator according to claim 1, wherein the oscillation characteristic of the electromagnetic waves is a frequency or a power of the electromagnetic waves.

11. An oscillator for oscillating electromagnetic waves having a frequency from 30 GHz to 30 THz, comprising:
    an active layer configured to generate the electromagnetic waves by intersubband transitions of a carrier;
    a resonator unit configured to resonate the electromagnetic waves generated by the active layer;
    a strain generating unit configured to generate strain of the active layer; and
    a control unit configured to control the strain generating unit in order to change an oscillation characteristic of the electromagnetic waves resonated by the resonator unit,
    wherein the oscillation characteristic of the electromagnetic waves resonated by the resonator unit is varied in accordance with a variation in a delay time of carriers in the active layer varied in accordance with the strain occurring in the active layer.

12. An oscillator for oscillating electromagnetic waves having a frequency from 30 GHz to 30 THz, comprising:
    an active layer configured to generate the electromagnetic waves by intersubband transitions of a carrier;
    a resonator unit configured to resonate the electromagnetic waves generated by the active layer;
    a strain generating unit configured to generate strain of the active layer; and
    a control unit configured to control the strain generating unit in order to change an oscillation characteristic of the electromagnetic waves resonated by the resonator unit,
    wherein the oscillation characteristic of the electromagnetic waves resonated by the resonator unit is varied in accordance with a variation in a resonant frequency of an equivalent circuit of the active layer varied in accordance with the strain occurring in the active layer.

* * * * *